United States Patent [19]

Foell et al.

[11] Patent Number: 5,010,294
[45] Date of Patent: Apr. 23, 1991

[54] METHOD FOR TOPICALLY-RESOLVED DETERMINATION OF THE DIFFUSION LENGTH OF MINORITY CHARGE CARRIERS IN A SEMICONDUCTOR CRYSTAL BODY WITH THE ASSISTANCE OF AN ELECTROLYTIC CELL

[75] Inventors: Helmut Foell; Volker Lehmann, both of Munich, Fed. Rep. of Germany

[73] Assignee: Siemens Aktiengesellschaft, Munich, Fed. Rep. of Germany

[21] Appl. No.: 522,115

[22] Filed: May 11, 1990

[30] Foreign Application Priority Data

May 31, 1989 [DE] Fed. Rep. of Germany ....... 3917702

[51] Int. Cl.$^5$ ............................................. G01R 31/26
[52] U.S. Cl. ............................ 324/158 D; 324/158 R; 324/73.1
[58] Field of Search ........... 324/158 D, 158 R, 158 T, 324/73.1, 71.3; 437/8; 136/290

[56] References Cited

U.S. PATENT DOCUMENTS

| | | | |
|---|---|---|---|
| 4,333,051 | 6/1982 | Goodman | 324/158 D |
| 4,433,288 | 2/1984 | Moore | 324/158 D |
| 4,454,472 | 6/1984 | Moore | 324/158 R |
| 4,511,838 | 4/1985 | Reichman et al. | 324/158 D |
| 4,841,239 | 6/1989 | Foell et al. | 324/158 D |
| 4,891,584 | 1/1990 | Kamieniecki et al. | 324/158 D |

FOREIGN PATENT DOCUMENTS

| | | |
|---|---|---|
| 0000489 | 8/1981 | European Pat. Off. |
| 0295440 | 12/1988 | European Pat. Off. |
| 1021955 | 1/1958 | Fed. Rep. of Germany |
| 2615036 | 11/1988 | France |
| 1514697 | 6/1978 | United Kingdom |

OTHER PUBLICATIONS

Grivet, F. et al, "Device for Detecting Defects in P-Silicon Substrate", IBM Technical Disclosure Bulletin, vol. 22, No. 4, 9/1979, p. 1499.

Das, "Non-destructive Electrolytic Localization of Pipe Sites in Bipolar Transistors", IBM Technical Disclosure Bulletin, vol. 20, No. 2, 7/1979, pp. 604–607.

Primary Examiner—Kenneth Wieder
Assistant Examiner—Vinh P. Nguyen
Attorney, Agent, or Firm—Hill, Van Santen, Steadman & Simpson

[57] ABSTRACT

The measurement of the diffusion length of minority charge carriers in a semiconductor crystal body is enabled in that the front side and the rear side of the crystal wafer are each respectively brought into contact with an electrolyte in a respective measuring cell and an inhibiting space charge zone is generated at the front side of the wafer. The front side is irradiated with light having a wave length of $\lambda > 800$ nm and the front side photocurrent $I_1$ of the minority charge carriers thereby generated is measured. The diffusion length L can be calculated from the photocurrent $I_1$ with the assistance of a mathematical equation. The topical distribution of the diffusion length L is obtained given point-by-point irradiation and scanning over the crystal wafer. Diffusion lengths of $L < 150$ μm can be measured by selecting a light source having a wave length of $\lambda > 800$ nm.

4 Claims, 2 Drawing Sheets

METHOD FOR TOPICALLY-RESOLVED DETERMINATION OF THE DIFFUSION LENGTH OF MINORITY CHARGE CARRIERS IN A SEMICONDUCTOR CRYSTAL BODY WITH THE ASSISTANCE OF AN ELECTROLYTIC CELL

CROSS REFERENCE TO RELATED APPLICATIONS

This application is related to an application Ser. No. (07/527277), filed May 22, 1990 and to an application Ser. No. (07/522107), filed May 11, 1990.

BACKGROUND OF THE INVENTION

1. Field of the Invention

The present invention relates to a method for providing a topically-resolved determination of the diffusion length of minority charge carriers in a semiconductor crystal body in which at least one electrolyte-filled measuring cell is applied to the semiconductor crystal body so that the front side of the body is in contact with the electrolyte, the semiconductor body is connected by way of an ohmic contact to a voltage source with which a voltage is applied between the semiconductor crystal body and an electrode located in the electrolyte, the front side of the semiconductor crystal body then being radiated with light from a light source, with which method defects and contaminants can be detected in a non-destructive manner.

2. Description of the Prior Art

Contaminants and defects in a semiconductor crystal body (generally and hereinafter referred to as a wafer) represent recombination centers for minority charge carriers. The diffusion length L of the minority charge carriers is therefore a measure for the density of defects in the wafer.

A method for the topically-resolved determination of the diffusion length L is disclosed in the European application 0 295 440. The front side and the rear side of the wafer are thereby each brought into contact with a respective electrolyte-filled measuring cell. An inhibiting space charge zone is generated at the rear side of the wafer with the assistance of a connected D.C. voltage source, the other pole of the voltage source being connected to an electrode located in the electrolyte of the measuring cell at the rear side. The front side of the wafer is irradiated with visible light of, for example, a helium-neon laser. The photo current of the generated minority charge carriers is detected at the rear side of the wafer and is normed to that measured at the front surface of the wafer. The diffusion length L is mathematically determined from this quotient.

The above method, however, can only be applied when the diffusion length L is greater than approximately 1/4th of the wafer thickness D since too few minority charge carriers otherwise diffuse up to the rear side of the wafer.

SUMMARY OF THE INVENTION

An object of the present invention is to enable the quantative and topically-resolved determination of the diffusion length L where $L < \frac{1}{4} D$ as well as in the normal circumstances in which $L > \frac{1}{4} D$.

In a method of the type generally set forth above, this object is achieved, according to the present invention, in that (a) an inhibiting space charge zone is generated at the front side of the wafer with a voltage that is applied between the wafer and an electrode in the front electrolyte;

(b) a light source having a wave length of $\lambda > 800$ nm is employed for the irradiation;

(c) the photocurrent $I_1$ of the minority charge carriers is measured at the front side; an (d) the diffusion length L is calculated with the assistance of the mathematical equation $$I_1/I_{1,max} = [\alpha L/(1+\alpha L)] \, e^{-\alpha \cdot w}$$

where $\alpha$ is the absorption coefficient for radiation having the wavelength $\lambda$ and w is the expanse of the space charge zone, and where $I_{1,max}$ is determined by calibration with the assistance of a specimen having a known, extremely great diffusion length.

According to a particular feature of the invention, the method is particularly characterized in that an electrolyte-filled measuring cell is employed at the front side of the semiconductor crystal body.

According to another feature of the invention, the method is particularly characterized in that a respective measuring cell is applied to the front side and to the rear side of the wafer, whereby at least the cell at the front side is filled with electrolyte.

According to another feature of the invention, the method is particularly characterized in that both measuring cells are filled with electrolyte so that the front side and the rear side of the wafer are each respectively in contact with the electrolyte of a measuring cell.

According to another feature of the invention, the method is particularly characterized in that the light beam is focused onto the front surface of the wafer and scans the front surface so that the topically-resolved determination occurs.

According to another feature of the invention, the method is particularly characterized in that a laser is employed as the light source.

According to another feature of the invention, the method is particularly characterized in that a light-emitting diode is employed as the light source.

According to another feature of the invention, the method is particularly characterized in that an inhibiting voltage is applied between the rear surface of the wafer and an electrode located in the cell at the rear surface and the rear side photocurrent $I_2$ of the minority charge carriers is additionally measured.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENT

Figure 1:
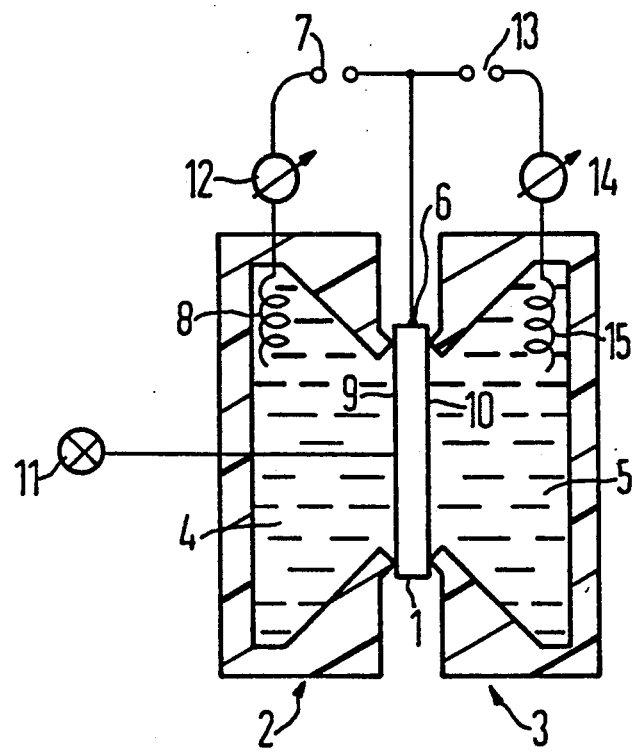
FIG. 1 is a schematic illustration of the measuring equipment employed in practicing the present invention.

Referring to FIG. 1, a wafer 1 is located between two measuring half cells 2, 3, hereinafter simply referred to as cells, filled with electrolyte 4, 5. For example 2% hydrofluoric acid with an additive of a wetting agent can be employed as the electrolyte. The wafer 1 is connected to a voltage source 7 via an ohmic contact 6; the other pole of the voltage source 7 is connected to an electrode 8 that is located in the electrolyte 4 in the measuring cell 2 of the front side. A voltage $U_1$ is set such at the voltage source 7 that an inhibiting space charge zone is formed at the front surface 9 of the wafer 1. When, for the semiconductor wafer 1 is composed of p silicon, then it is negatively biased and the voltage $U_1$ amounts to approximately 5 volts.

The front surface 9 of the wafer 1 is illuminated with a light source 11, whereby the light spot is focused to amount to 1 mm$^2$ and can scan the wafer surface. The teaching of the invention is to employ a light source having a fixed wavelength $\lambda > 800$ nm since electron-hole pairs are then generated not only at the wafer surface but also deeper in the specimen.

Figure 2:
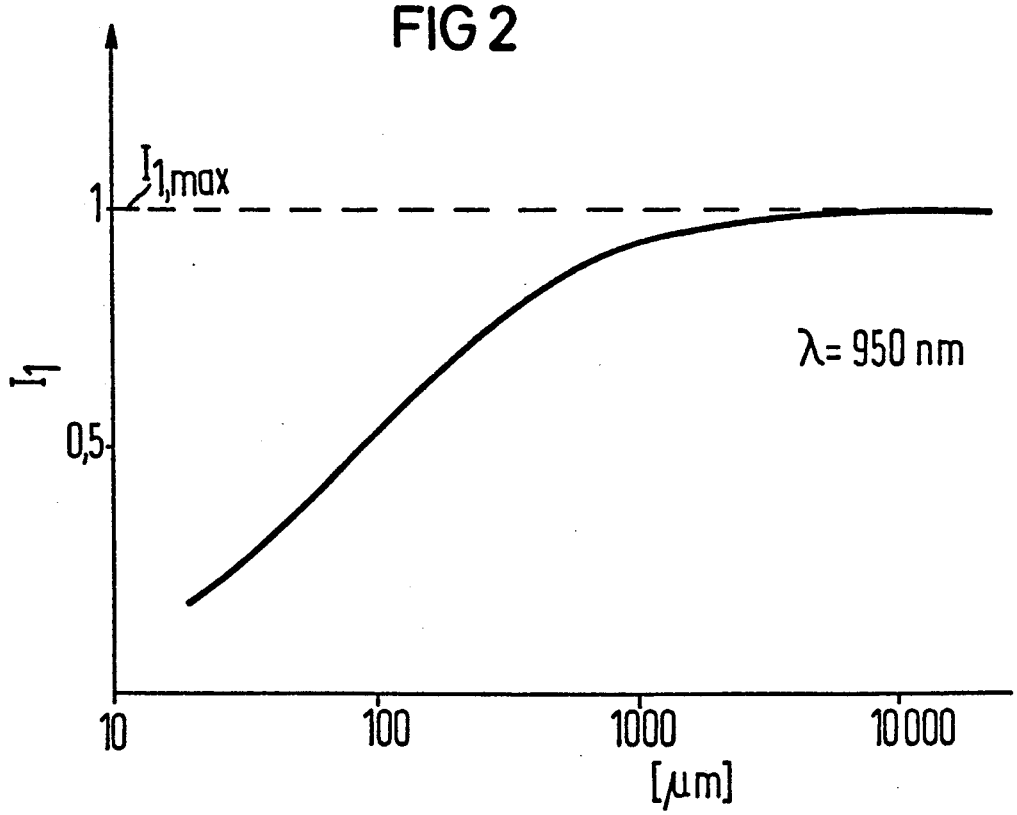
FIG. 2 is a graphic illustration showing the dependency of the measured photocurrent $I_1$ of the front side of a semiconductor wafer with respect to the diffusion length L.

The photocurrent $I_1$ of the minority charge carriers is measured with an ammeter 12; under given conditions, it is a known function of the number of generated charge carriers and of the diffusion length L, where:

$$I_1 = [(q \cdot \Phi \cdot \alpha L)/(1+L)] \, e^{-\alpha W} \text{ for } D >> L$$

$$I_{1,max} = q \cdot \Phi$$

as shown in FIG. 2 where q denotes a elementary charge $\Phi$ is the photon flow, $\alpha$ is the absorption coefficient of the wavelength $\lambda$ in the semiconductor, L is the diffusion length of the minority charge carriers, W is the expanse of the space charge zone, and D is the thickness of the wafer 1.

Figures 3A, 3B:
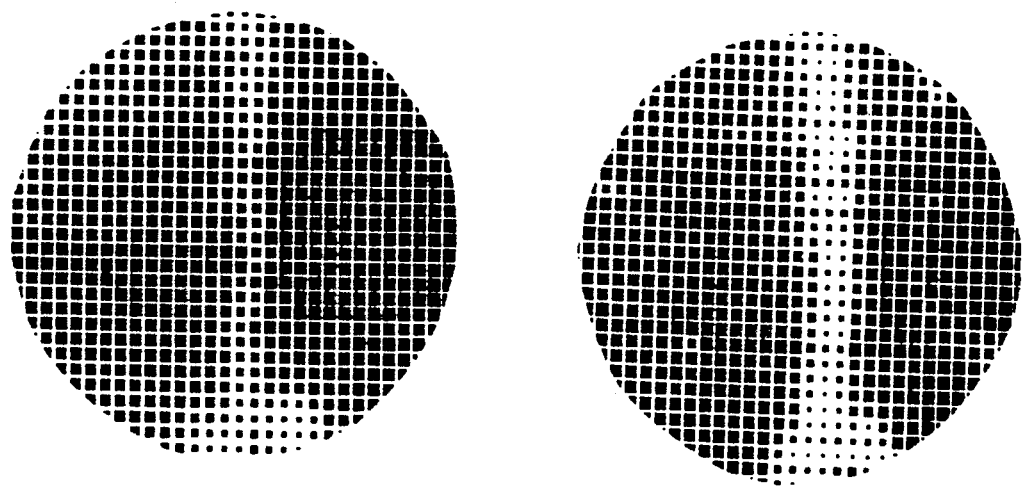
FIG. 3a illustrates the topical distribution of the diffusion length over a wafer intentionally contaminated in the center line determined with the measuring method of the present invention.
FIG. 3b illustrates the topical distribution of the diffusion length over a wafer intentionally contaminated in the center line and as determined with the measuring

$I_{1,max}$ corresponds to the current at which all generated minority charge carriers are acquired and is determined by calibration with the assistance of a specimen having a known, extremely-long diffusion length. FIG. 3a illustrates the topically-resolved measurement of the diffusion length L over a wafer intentionally contaminated at a center line in accordance with the method of the present invention; for comparative purposes, FIG. 3b illustrates the measurement result obtained with the measuring method of the aforementioned European application 0 295 440.

Various embodiments of the disclosed method of the invention are possible:

1. In addition to conventional light sources having appropriate filters and focusing optics, light-emitting diodes, Nd-YAG lasers and semiconductor laser are also suitable for use as the light source 11.
2. The electrolyte-filled second measuring cell 3 at the rear surface 10 of the wafer 1 can be additionally connected to a voltage source 13 in such a fashion that an inhibiting space charge zone arises at the rear surface 10 of the wafer 1. A rear side photocurrent $I_2$ of minority charge carriers can then be measured with an ammeter 14, the rear side photocurrent $I_2$ then likewise serving for the calculation of the diffusion length L according to the aforementioned European application.
3. The electrolyte-filled second measuring cell 3 at the rear surface 10 of the wafer 1 serves the purpose of producing defined conditions at the rear surface 10 of the specimen, particularly a defined surface state density. However, it is not necessary for the measuring principle of the present invention and can remain empty or can be omitted in order to simplify the measuring arrangement.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for determining the diffusion length L of minority charge carriers in a semiconductor crystal body carrying an ohmic contact, comprising the steps of:

applying a measuring cell having an electrode therein to one side of the semiconductor crystal body so that a first surface thereof is exposed to the interior of the measuring cell;

filling the measuring cell with electrolyte so that the surface and the electrode are in contact with the electrolyte;

applying a voltage between the electrode and the ohmic contact to produce an inhibiting space charge zone at the first surface of the semiconductor crystal body;

irradiating the surface with light having a predetermined wavelength $\lambda > 800$ nm to produce a photocurrent $I_1$ between the first surface and the electrode;

measuring the photocurrent $I_1$; and determining the diffusion length L from the equation $$I_1/I_{1,max} = (\alpha L/(1+\alpha L)) \, e^{-\alpha w}$$

where $\alpha$ is the absorption coefficient for radiation having the predetermined wavelength $\lambda$, w is the expanse of the inhibiting space charge zone, and $I_{1,max}$ is a calibrated current obtained from a known specimen having an extremely long diffusion length.

2. The method of claim 1, wherein the step of irradiating is further defined as:

focusing light onto the first surface; and scanning the focused light across the first surface to obtain a topically-resolved determination.

3. The method of claim 2, wherein the step of irradiating is further defined as:

focusing a laser beam on the first surface.

4. The method of claim 2, wherein the step of irradiating is further defined as:

energizing a light-emitting diode to produce the light.

* * * * *